(12) United States Patent
Horie

(10) Patent No.: US 7,420,998 B2
(45) Date of Patent: Sep. 2, 2008

(54) SEMICONDUCTOR LASER DEVICE

(75) Inventor: Junichi Horie, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 163 days.

(21) Appl. No.: 11/086,440

(22) Filed: Mar. 23, 2005

(65) Prior Publication Data

US 2005/0221549 A1    Oct. 6, 2005

(30) Foreign Application Priority Data

Apr. 6, 2004    (JP) .............................. 2004-112254
Dec. 24, 2004  (JP) .............................. 2004-372897

(51) Int. Cl.
*H01S 5/00*    (2006.01)

(52) U.S. Cl. .................... 372/43.01; 372/50.1; 257/79; 257/85; 257/94; 257/768

(58) Field of Classification Search ..... 372/43.01–50.1; 257/79–81, 94, 99, 768, 769, 778, 773
See application file for complete search history.

(56) References Cited

U.S. PATENT DOCUMENTS

| | | | | |
|---|---|---|---|---|
| 5,764,672 | A | * | 6/1998 | Ukita et al. .............. 372/45.01 |
| 6,087,194 | A | * | 7/2000 | Matsukura et al. ............ 438/25 |
| 2001/0024460 | A1 | * | 9/2001 | Yamamoto et al. ............ 372/36 |
| 2002/0001327 | A1 | * | 1/2002 | Goto ........................... 372/45 |
| 2002/0125490 | A1 | * | 9/2002 | Chuman et al. ............... 257/93 |
| 2006/0078024 | A1 | * | 4/2006 | Matsumura et al. ...... 372/46.01 |

FOREIGN PATENT DOCUMENTS

| | | | |
|---|---|---|---|
| JP | 07-030095 | * | 1/1995 |
| JP | 2000-133871 | | 5/2000 |
| JP | 2000-133871 | * | 12/2000 |
| JP | 2001-068782 | | 3/2001 |

* cited by examiner

*Primary Examiner*—Minsun Harvey
*Assistant Examiner*—Delma R Flores Ruiz
(74) *Attorney, Agent, or Firm*—Leydig, Voit & Meyer, Ltd.

(57) ABSTRACT

A semiconductor laser device has a front surface electrode formed by Au plating, a rear surface electrode formed by Au plating, an anti-adhesive film only on the front surface electrode and made of a material that does not react with Au, and a coating film that covers an end face on a light emitting side and an end face opposite the light emitting side. The anti-adhesive films are located on the four corners of the front surface electrode.

4 Claims, 5 Drawing Sheets

SEMICONDUCTOR LASER DEVICE

BACKGROUND OF THE INVENTION

1. Field of the Invention

The present invention relates to a semiconductor laser device that makes it possible to prevent laser bars from thermo-compressively bonding each other without using dummy bars when coating end faces thereof.

2. Background Art

A manufacturing method for semiconductor laser devices includes a process of coating end faces. In the end face coating process, coating films are formed on end faces of semiconductor laser devices to control the reflectance of end faces at a light emitting side and end faces at the opposite side therefrom of semiconductor laser devices. The end face coating process is an important process that significantly influences characteristics, such as threshold values, of semiconductor laser devices.

A conventional manufacturing method for semiconductor laser devices, which includes the end face coating process, will be described. First, a multi-layer structure that permits laser oscillation is formed on a semiconductor substrate. Then, front surface electrodes are formed on the front surface of the semiconductor substrate by Au plating, and rear surface electrodes are formed on the rear surface thereof by Au plating. Next, the semiconductor substrate is cleaved to produce laser bars, each of which having a plurality of semiconductor laser devices with their end faces exposed.

Subsequently, the plurality of laser bars is stacked and clamped by a jig to retain them, and then coating films are formed on the end faces on the light emitting side of the laser bars. In the same manner, coating films are formed on the opposite side faces of the laser bars. After forming the coating films, the laser bars are separated and then, the laser bars are divided into individual semiconductor laser devices. This completes the fabrication of the semiconductor laser devices.

The front surface of the conventional semiconductor laser device obtained as described above is shown in FIG. 7. Referring to FIG. 7, a conventional semiconductor laser device 31 has a front surface electrode 32 formed by Au plating, and also a rear surface electrode (not shown) formed by Au plating.

Coating the end faces with the laser bars in contact with each other, as described above, has been posing the following problem. The heat applied while coating the end faces and the pressure applied to the laser bars when setting them with a jig cause thermo-compressive bonding between the front surface electrodes and the rear surface electrodes, thus preventing the laser bars from being separated after the end face coating. This is because of the mutual thermo-compressive bonding attributable to the fact that the front surface electrodes and the rear surface electrodes of the laser bars are both formed of Au plating.

As a solution to this problem, dummy bars made of Si or the like have been used. More specifically, to coat the end faces, laser bars 33 and dummy bars 34 are alternately disposed and set on a jig 35 so as to prevent the laser bars from directly contacting each other, as shown in FIG. 8 (refer to, for example, Japanese Unexamined Patent Application Publication No. 2000-133871).

The conventional method using such dummy bars, however, has been disadvantageously adding to manufacturing cost and reducing the number of laser bars that can be actually set to a jib.

SUMMARY OF THE INVENTION

The present invention has been made with a view toward solving the problems described above, and it is an object of the invention to provide a semiconductor laser device capable of preventing laser bars from thermo-compressively bonding each other when coating end faces without the need for using dummy bars.

According to one aspect of the present invention, a semiconductor laser device has a front surface electrode formed by Au plating, a rear surface electrode formed by Au plating, an anti-adhesive film that is formed only on the front surface electrode and made of a material that does not react with Au, and a coating film that covers an end face on a light emitting side and an end face on the opposite side therefrom. The anti-adhesive films are formed on the four corners of the front surface electrode.

The features and advantages of the present invention may be summarized as follows.

The semiconductor laser device and its manufacturing method thereof in accordance the present invention make it possible to restrain the thermal-compressive bonding between adjoining laser bars. Moreover, dummy bars are not required, so that the manufacturing cost can be reduced and more laser bars can be set on jigs, permitting higher throughput to be achieved.

Other and further objects, features and advantages of the invention will appear more fully from the following description.

DETAILED DESCRIPTION OF THE PREFERRED EMBODIMENTS

First Embodiment

The following will describe a method for fabricating a semiconductor laser device according to a first embodiment of the present invention.

Figure 1A:
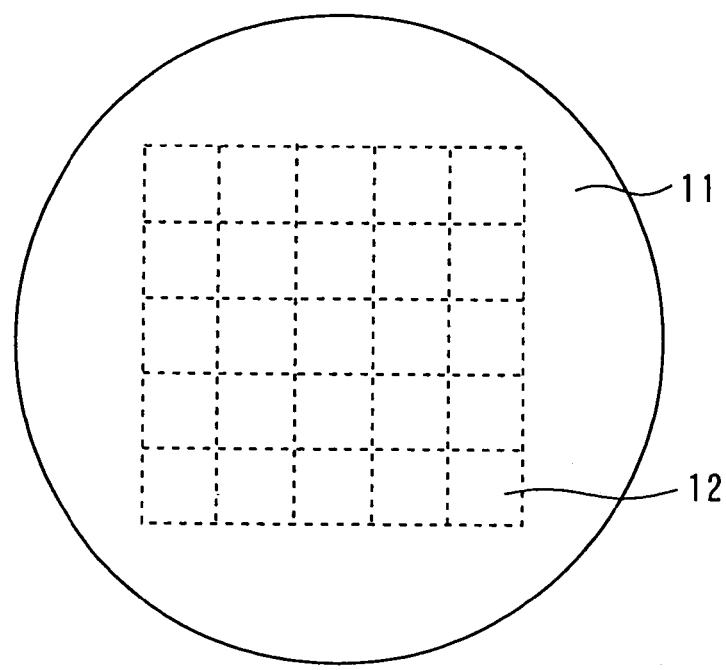
FIGS. 1A and 1B are diagrams showing a front surface of a semiconductor laser device according to a first embodiment of the present invention.

First, a multi-layer structure that permits laser oscillation is formed on a semiconductor substrate 11 by using an MBE crystal growth system or an MOCVD crystal growth system. Then, front surface electrodes are formed on the front surface of the semiconductor substrate 11 by Au plating and rear surface electrodes are formed on the rear surface of the semiconductor substrate 11 by Au plating. This produces a plurality of semiconductor laser devices 12 in a matrix pattern in the semiconductor substrate 11, as shown in FIG. 1A.

Figure 1B:
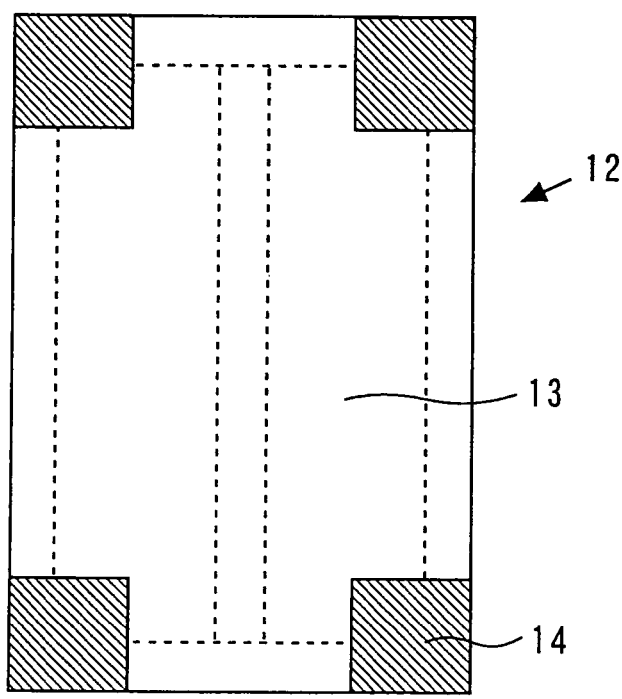

Next, as shown in FIG. 1B, anti-adhesive films 14 are formed only on the four corners of the front surface electrode 13 of each of the semiconductor laser devices 12 by vapor deposition or sputtering. The anti-adhesive films 14 are made of a material that does not react with Au. Specifically, the anti-adhesive films 14 are insulating films or Pt films. Thickness of the anti-adhesive films 14 are more than 0.05 μm and less than 5 μm. If their thickness are less than 0.05 μm, their anti-adhesive effects are reduced. If their thickness are more than 5 μm, they are possibly peeled off.

Figure 2A:
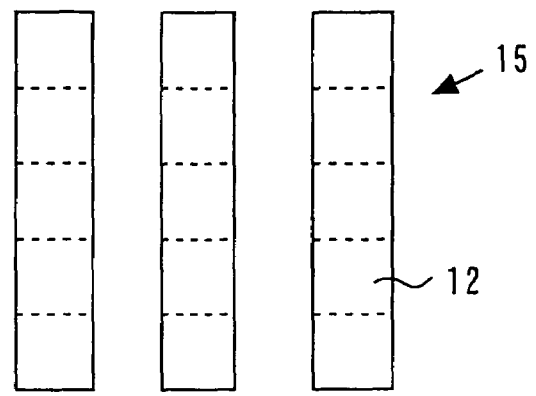
FIGS. 2A, 2B, and 2C are schematic diagrams showing laser bars, each including a plurality of semiconductor laser devices according to the present invention, the laser bars having been set on a jig.

The semiconductor substrate is cleaved to obtain laser bars 15, each of which includes a plurality of the semiconductor laser devices 12 with their end faces exposed, as shown in FIG. 2A.

Figure 2B:
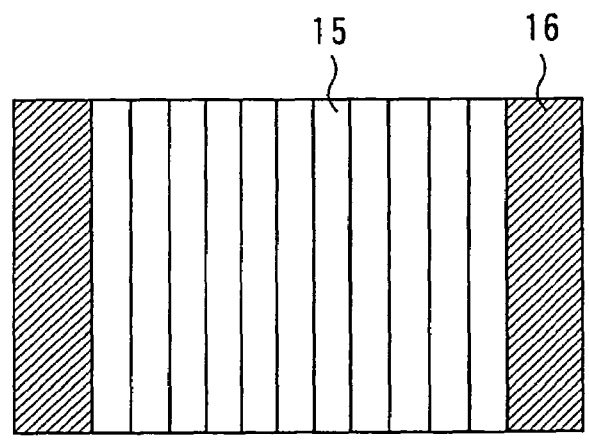

Then, as shown in FIG. 2B, the plural laser bars 15 are stacked such that their end faces on the light emitting side face upward, and clamped by a jig 16 to hold them. The plural laser bars retained by the jig 16 are supplied to a film forming system. Then, a coating film of $SiO_2$ or the like is formed on the end faces at the light emitting side of the laser bars by sputtering, vacuum deposition, CVD or the like. In the same manner, a coating film is formed on the end faces at the opposite side therefrom of the laser bars.

In the process for coating the end faces, the front surface electrodes and the rear surface electrodes of adjoining laser bars are isolated by the anti-adhesive film so as to prevent direct contact therebetween. Meanwhile, the anti-adhesive film is in contact with the rear surface electrodes of the adjoining laser bars. However, the anti-adhesive film is formed of a material that does not react with Au, so that its contact with the rear surface electrodes will not lead to thermo-compressive bonding.

After coating the end faces, the plurality of laser bars is separated into individual laser bars, and then the laser bars are divided into individual semiconductor laser devices. Thus, the individual semiconductor laser devices are completed.

Figure 2C:
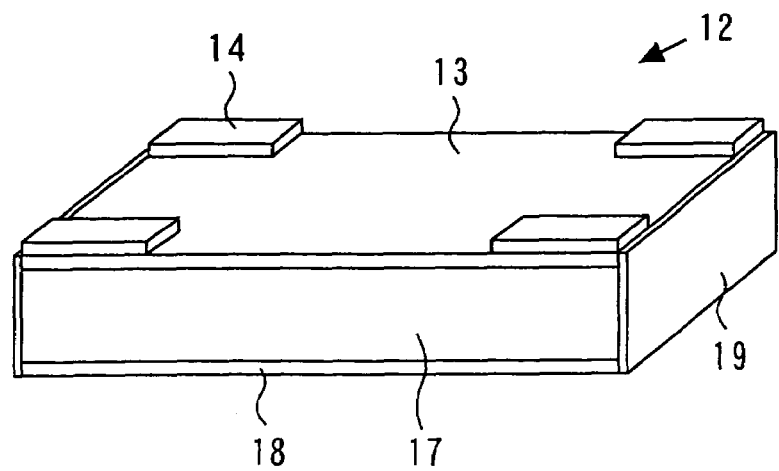

The semiconductor laser device 12 obtained as described above has a laser main body 17 having the multi-layer structure that permits laser oscillation, a front surface electrode 13 formed on the front surface of the laser main body 17 by Au plating, a rear surface electrode 18 formed on the rear surface of the laser main body 17 by Au plating, anti-adhesive films 14 formed only on the front surface electrode 13 and made of a material that does not react with Au, and coating films 19 that cover the end face at the light emitting side and the end face at the opposite side therefrom, as shown in FIG. 2C. The anti-adhesive films 14 are formed on the four corners of the front surface electrode 13. When width of the semiconductor laser device 12 is 200 μm, width of the anti-adhesive films 14 are less than 90 μm. If width of anti-adhesive films 14 are more than 90 μm, they are on an active layer near the center of the semiconductor laser device 12 and they disturb laser oscillation.

The semiconductor laser device and its manufacturing method thereof in accordance with the first embodiment of the present invention make it possible to restrain the thermal-compressive bonding between adjoining laser bars. Moreover, dummy bars are not required, so that the manufacturing cost can be reduced and more laser bars can be set on jigs, permitting higher throughput to be achieved.

Second Embodiment

Figure 3:
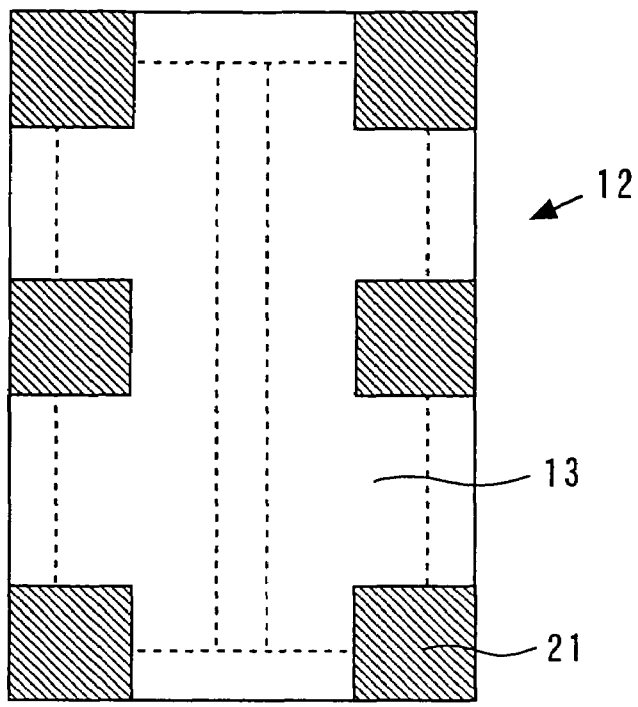
FIG. 3 is a diagram showing a front surface of a semiconductor laser device according to a second embodiment of the present invention.

A method for fabricating a semiconductor laser device according to a second embodiment of the present invention differs from that according to the first embodiment in the pattern for forming the anti-adhesive films on each semiconductor laser device formed on a semiconductor substrate. In the second embodiment, anti-adhesive films 21 are formed on the four corners and at centers of both sides on a front surface electrode 13 of a semiconductor laser device 12 by vapor deposition or sputtering, as shown in FIG. 3. The anti-adhesive films 21 are made of a material that does not react with Au. Specifically, the anti-adhesive films 21 are insulating films or Pt films. Thickness of the anti-adhesive films 14 are more than 0.05 μm and less than 5 μm. If their thickness are less than 0.05 μm, their anti-adhesive effects are reduced. If their thickness are more than 5 μm, they are possibly peeled off. When width of the semiconductor laser device 12 is 200 μm, width of the anti-adhesive films 14 are less than 90 μm. If width of anti-adhesive films 14 are more than 90 μm, they are on an active layer near the center of the semiconductor laser device 12 and they disturb laser oscillation.

The semiconductor laser devices obtained as described above have the anti-adhesive films that are formed only on the front surface electrodes and made of a material that does not react with Au. In the present embodiment, each semiconductor laser device has the anti-adhesive films 21 formed on the four corners and at the centers of both sides of the front surface electrode 13, as shown in FIG. 3. The rest of the construction of the second embodiment is identical to the construction of the semiconductor laser device according to the first embodiment.

The semiconductor laser device and the method for fabricating the same according to the second embodiment of the present invention provides the same advantages as those provided by the first embodiment, and also restrains concentration of stress in each semiconductor laser device when a plurality of laser bars is set on jigs, thus protecting each semiconductor laser deice from being damaged.

Third Embodiment

Figure 4:
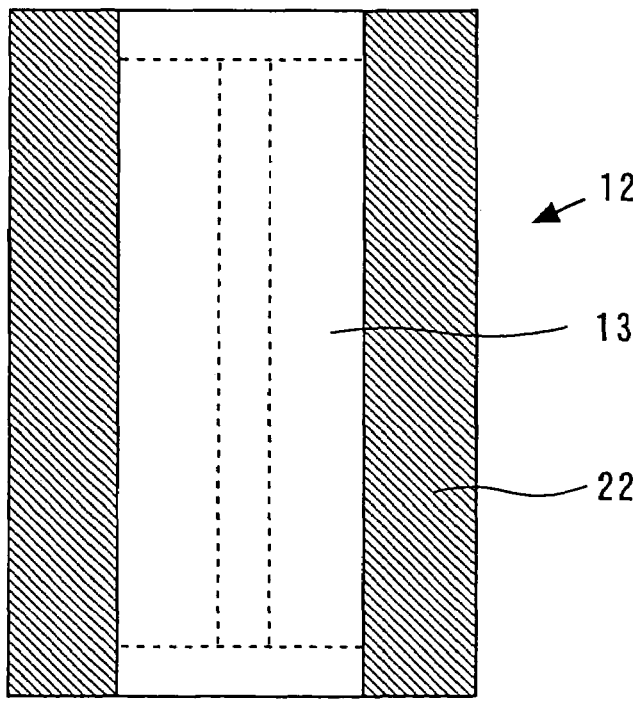
FIG. 4 is a diagram showing a front surface of a semiconductor laser device according to a third embodiment of the present invention.

A method for fabricating a semiconductor laser device according to a third embodiment of the present invention differs from that according to the first embodiment in the pattern for forming the anti-adhesive films on each semiconductor laser device formed on a semiconductor substrate. In the third embodiment, anti-adhesive films 22 are formed along both sides on a front surface electrode 13 of a semiconductor laser device 12 by vapor deposition or sputtering, as shown in FIG. 4. The anti-adhesive films 22 are made of a material that does not react with Au. Specifically, the anti-adhesive films 22 are insulating films or Pt films. Thickness of the anti-adhesive films 14 are more than 0.05 μm and less than 5 μm. If their thickness are less than 0.05 μm, their anti-adhesive effects are reduced. If their thickness are more than 5 μm, they are possibly peeled off. When width of the semiconductor laser device 12 is 200 μm, width of the anti-adhesive films 14 are less than 90 μm. If width of anti-adhesive films 14 are more than 90 μm, they are on an active layer near the center of the semiconductor laser device 12 and they disturb laser oscillation.

The semiconductor laser devices obtained as described above have the anti-adhesive films that are formed only on the front surface electrodes and made of a material that does not react with Au. In the present embodiment, each semiconductor laser device has the anti-adhesive films 22 formed along both sides of the front surface electrode 13, as shown in FIG. 4. The rest of the construction of the third embodiment is identical to the construction of the semiconductor laser device according to the first embodiment.

The semiconductor laser device and the manufacturing method thereof according to the third embodiment of the present invention provide the same advantages as those of the first embodiment, and also improve solder wettability when incorporating the semiconductor laser device in a module or the like.

Fourth Embodiment

Figure 5:
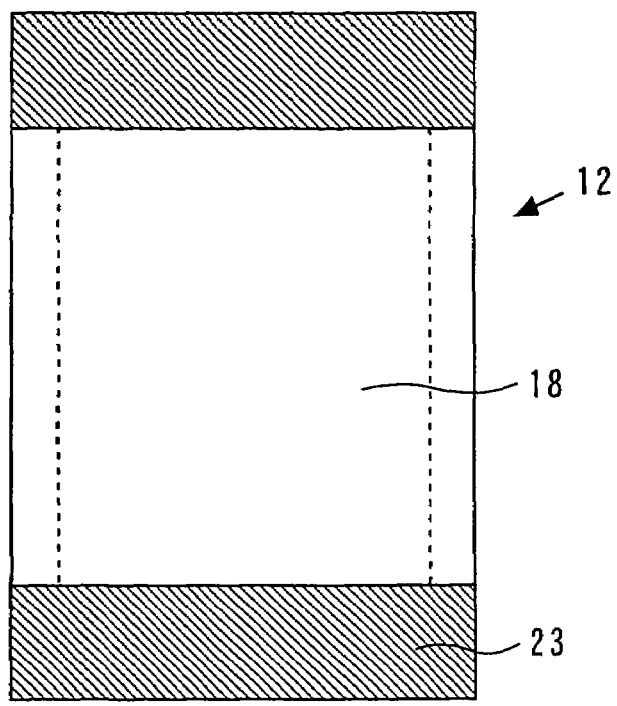
FIG. 5 is a diagram showing a rear surface of a semiconductor laser device according to a fourth embodiment of the present invention.

A method for fabricating a semiconductor laser device according to a fourth embodiment of the present invention differs from that according to the first embodiment in the pattern for forming the anti-adhesive films on each semiconductor laser device formed on a semiconductor substrate and also differs in the electrodes to be formed. In the fourth embodiment, anti-adhesive films 23 are formed along both sides at the light emitting side and the opposite side therefrom of a rear surface electrode 18 of a semiconductor laser device 12 by vapor deposition or sputtering, as shown in FIG. 5. The anti-adhesive films 23 are made of a material that does not react with Au. Specifically, the anti-adhesive films 23 are insulating films or Pt films. Thickness of the anti-adhesive films 14 are more than 0.05 µm and less than 5 µm. If their thickness are less than 0.05 µm, their anti-adhesive effects are reduced. If their thickness are more than 5 µm, they are possibly peeled off. Because width of a solder for electric connecting is about 80 µm, width of exposed electrode needs about 80 µm.

The semiconductor laser devices obtained as described above have the anti-adhesive films that are formed only on the rear surface electrodes and made of a material that does not react with Au. In the present embodiment, each semiconductor laser device has the anti-adhesive films 23 formed along both sides at the light emitting side and the opposite side therefrom of the rear surface electrode 18, as shown in FIG. 5. No anti-adhesive films are formed on the front surface electrode. The rest of the construction of the fourth embodiment is identical to the construction of the semiconductor laser device according to the first embodiment.

The semiconductor laser device and the manufacturing method thereof according to the fourth embodiment of the present invention provide the same advantages as those of the first embodiment, and also provide an additional advantage in that heat dissipation during laser oscillation is not affected.

Fifth Embodiment

Figure 6:
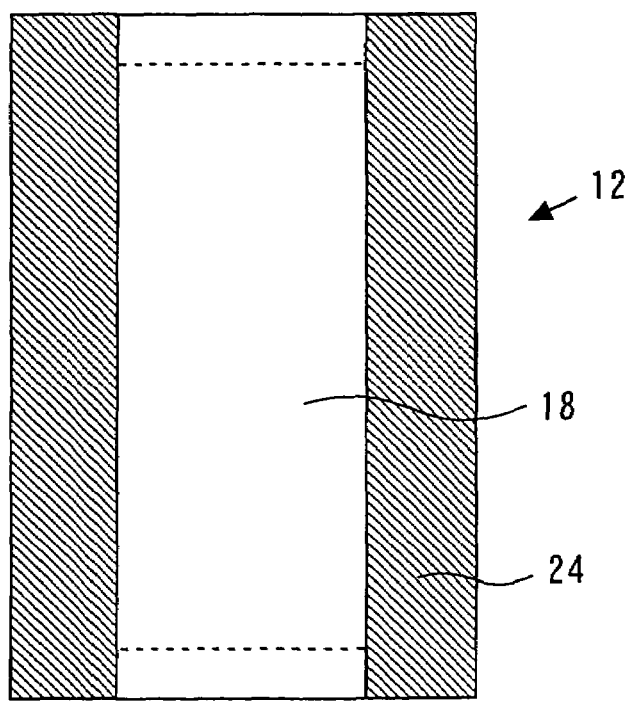
FIG. 6 is a diagram showing a rear surface of a semiconductor laser device according to a fifth embodiment of the present invention.
Figure 7:
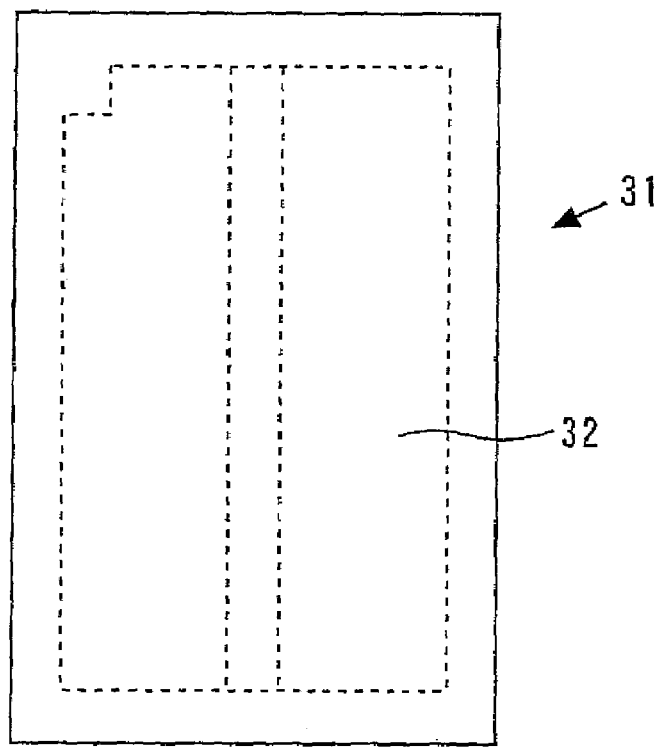
FIG. 7 is a diagram showing a front surface of a conventional semiconductor laser device.
Figure 8:
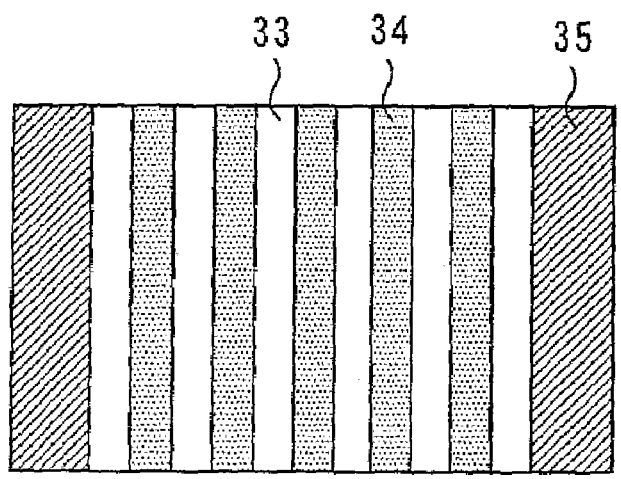
FIG. 8 is a schematic diagram showing laser bars, each including a plurality of conventional semiconductor laser devices, which have been set on jigs.

A method for fabricating a semiconductor laser device according to a fifth embodiment of the present invention differs from that according to the first embodiment in the pattern for forming the anti-adhesive films on each semiconductor laser device formed on a semiconductor substrate and also differs in the electrodes to be formed. In the fifth embodiment, anti-adhesive films 24 are formed along both sides on a rear surface electrode 18 of a semiconductor laser device 12 by vapor deposition or sputtering, as shown in FIG. 6. The anti-adhesive films 24 are made of a material that does not react with Au. Specifically, the anti-adhesive films 24 are insulating films or Pt films. Thickness of the anti-adhesive films 14 are more than 0.05 µm and less than 5 µm. If their thickness are less than 0.05 µm, their anti-adhesive effects are reduced. If their thickness are more than 5 µm, they are possibly peeled off. Because width of a solder for electric connecting is about 80 µm, width of exposed electrode needs about 80 µm.

The semiconductor laser devices obtained as described above have the anti-adhesive films that are formed only on the rear surface electrodes and made of a material that does not react with Au. In the present embodiment, each semiconductor laser device has the anti-adhesive films 24 formed along both sides of the rear surface electrode 18, as shown in FIG. 6. No anti-adhesive films are formed on the front surface electrode. The rest of the construction of the fifth embodiment is identical to the construction of the semiconductor laser device according to the first embodiment.

The semiconductor laser device and the manufacturing method thereof according to the fifth embodiment of the present invention provide the same advantages as those of the fourth embodiment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2004-112254, filed on Apr. 6, 2004 and a Japanese Patent Application No. 2004-372897, filed on Dec. 24, 2004 including specification, claims, drawings and summary, on which the Convention priority of the present application is based, are incorporated herein by reference in its entirety.

What is claimed is:

1. A semiconductor laser device comprising:
   a semiconductor laser having opposed front and rear surfaces and first and second end faces that are transverse to the front and rear surfaces;
   a plated Au front surface electrode located on the front surface, the front surface electrode including four corners;
   a plated Au rear surface electrode located on the rear surface;
   a film that does not react with Au and that is located only at four of the corners of the front surface electrode, with the front surface electrode sandwiched between the semiconductor laser and the anti-adhesive film; and
   a coating film that covers the first end face on a light-emitting side of the semiconductor laser device and the second end face opposite the light-emitting side of the semiconductor laser device.

2. A semiconductor laser device comprising:
   a plated Au front surface electrode, the front surface electrode including four corners;
   a plated Au rear surface electrode;
   a film that does not react with Au and that is located only at four of the corners of the front surface electrode; and
   a coating film that covers an end face of the semiconductor laser device on a light-emitting side and an end face of the semiconductor laser device opposite the light-emitting side.

3. The semiconductor laser device according to claim 1, wherein the film that does not react with Au is selected from the group consisting of an insulating film and a Pt film.

4. The semiconductor laser device according to claim 1, wherein the film that does not react with Au is a film formed by a vapor deposition process or a sputtering process.

* * * * *